(12) United States Patent
Amirante et al.

(10) Patent No.: US 7,692,974 B2
(45) Date of Patent: Apr. 6, 2010

(54) MEMORY CELL, MEMORY DEVICE, DEVICE AND METHOD OF ACCESSING A MEMORY CELL

(75) Inventors: Ettore Amirante, Munich (DE); Thomas Fischer, Munich (DE); Peter Huber, Munich (DE); Martin Ostermayr, LaGrange, NY (US)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/861,286

(22) Filed: Sep. 26, 2007

(65) Prior Publication Data

US 2009/0080271 A1  Mar. 26, 2009

(51) Int. Cl.
*G11C 7/10* (2006.01)
*G11C 8/00* (2006.01)

(52) U.S. Cl. ............................ 365/189.04; 365/230.05

(58) Field of Classification Search ............. 365/189.04
See application file for complete search history.

(56) References Cited

U.S. PATENT DOCUMENTS

| 5,036,491 | A  | * | 7/1991  | Yamaguchi      | 365/189.07 |
| 5,276,837 | A  | * | 1/1994  | Sakaue         | 365/230.05 |
| 6,201,758 | B1 | * | 3/2001  | Morishima et al. | 365/230.05 |
| 6,480,947 | B1 | * | 11/2002 | Hasegawa et al. | 711/167 |
| 6,711,086 | B2 | * | 3/2004  | Terada         | 365/230.05 |
| 6,804,143 | B1 |   | 10/2004 | Hobson         |          |
| 7,042,792 | B2 | * | 5/2006  | Lee et al.     | 365/230.05 |
| 7,254,088 | B2 | * | 8/2007  | Kurumada et al. | 365/230.05 |
| 7,260,018 | B2 | * | 8/2007  | Nii            | 365/230.05 |
| 2002/0114181 | A1 | * | 8/2002 | Shau          | 365/154 |
| 2006/0126420 | A1 | * | 6/2006 | Kurumada et al. | 365/230.05 |

* cited by examiner

*Primary Examiner*—Son L Mai
(74) *Attorney, Agent, or Firm*—SpryIP, LLC

(57) ABSTRACT

Implementations are presented herein that relate to a memory cell, a memory device, a device and a method of accessing a memory cell.

20 Claims, 9 Drawing Sheets

MEMORY CELL, MEMORY DEVICE, DEVICE AND METHOD OF ACCESSING A MEMORY CELL

BACKGROUND

Trends in the development of semiconductor chips show that the area occupied by memory is increasing. If these trends continue, a large part of a System on Chip's overall area will be occupied by memory. Semiconductor technology is scaled down to achieve higher densities of memories. Variations in manufacturing parameters, e.g. variations in number and location of dopant atoms in a channel region of a transistor, increase in accordance with scaling down technology. Correspondingly, threshold voltages of transistors forming memory cells vary increasingly, which makes it difficult to perform stable write and stable read operations.

Besides achieving higher densities of memories, it is generally desirable to save power in applications that use memory that occupies a large amount of chip-area. Scaling the supply voltage is one approach used to save power. A low supply voltage together with variations in manufacturing parameters may lead to memory cell access errors, especially during write operations.

BRIEF DESCRIPTION OF THE DRAWINGS

The detailed description is described with reference to the accompanying figures. The use of the same reference numbers in different figures indicates similar or identical items.

DETAILED DESCRIPTION

In accordance with an implementation described herein, a memory cell includes a first data node and a second data node. The first and second data nodes store complementary data. In addition, the memory cell includes at least four access devices and a first input signal is coupled to two access devices and a second input signal is coupled to another two access devices. The memory cell also includes a first complementary bit line pair and a second complementary bit line pair. Both, the first complementary bit line pair and the second complementary bit line pair, are coupled to the first and second data nodes. The first input signal and the second input signal activate a read access to the memory cell with every write access to the memory cell. In response to a potential on the first input signal the first complementary bit line pair may be coupled to the first and second data nodes. In response to a potential on the second input signal the second complementary bit line pair may be coupled to the first and second data nodes.

Figure 1:
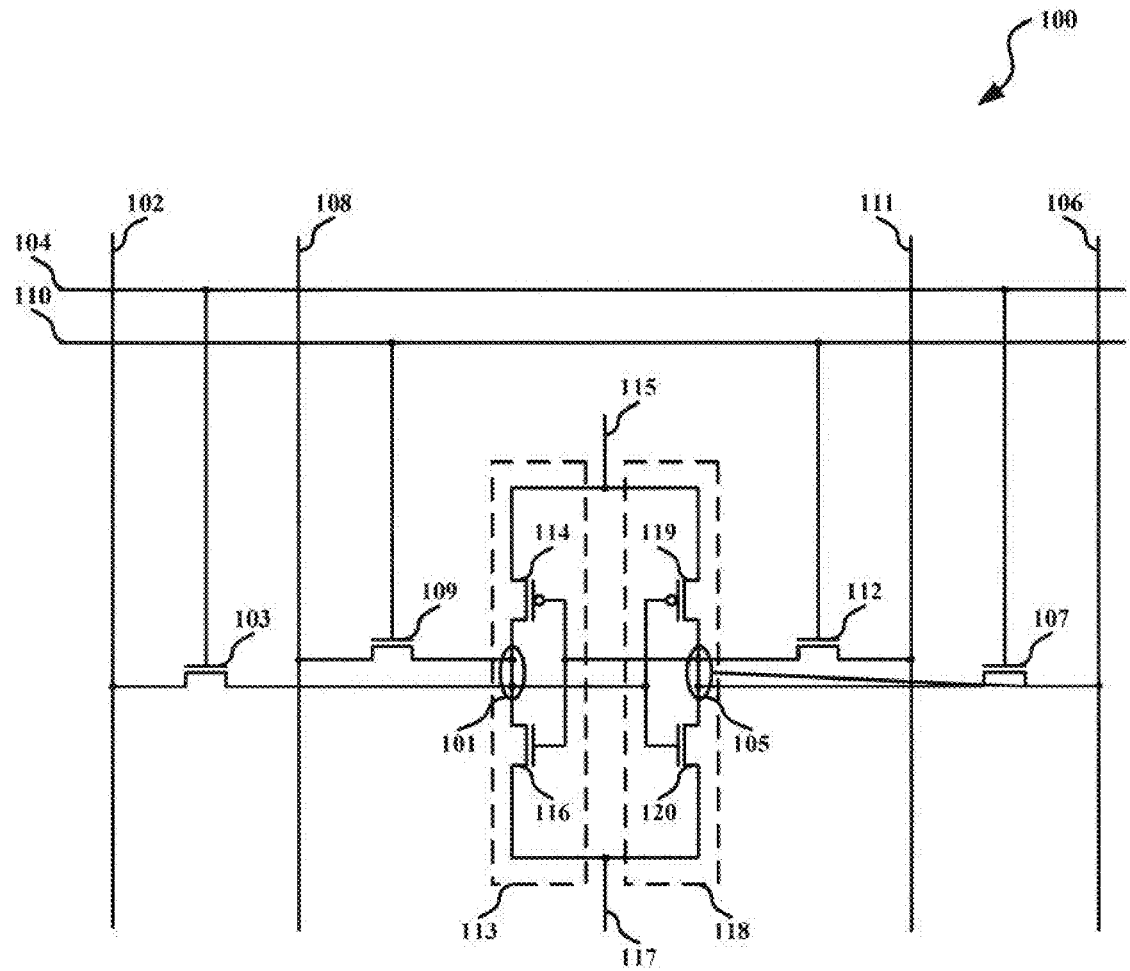
FIG. 1 illustrates a schematic circuit diagram of a memory cell.

FIG. 1 illustrates a schematic circuit diagram of a memory cell 100 in accordance with a further implementation described herein. In FIG. 1, a first data node 101 is coupled to a first bit line 102. A first access device 103 is coupled to a first word line 104. A second data node 105 is coupled to a second bit line 106. A second access device 107 is coupled to the first word line 104. The first data node 101 is also coupled to a third bit line 108. A third access device 109 is coupled to a second word line 110. The second data node 105 is also coupled to a fourth bit line 111. A fourth access device 112 is coupled to the second word line 110. The memory cell 100 stores data opposite to each other, i.e. first data node 101 and second data node 105 store complementary data. First bit line 102 and second bit line 106 hold data complementary to each other and third bit line 108 and fourth bit line 111 hold data complementary to each other, i.e. first bit line 102 and second bit line 106 form a complementary bit line pair and third bit line 108 and fourth bit line 111 form a complementary bit line pair. The first word line 104 and the second word line 110 of memory cell 100 activate a read access to the memory cell 100 with every write access to the memory cell 100.

Use of complementary bit line pairs enables differential access to data stored in the first data node 101 and in the second data node 105. This allows readout of the memory cell 100, i.e. sensing of the complementary bit line pairs, even in the presence of noise or offsets. Therefore, if the memory cell 100 is integrated in e.g. a System on Chip, it may not be susceptible to any noise in neighboring circuit elements.

Referring to FIG. 1, the first access device 103 may be further coupled to the first bit line 104 and to the first data node 101. The first data node 101 may be coupled to the first bit line 102 through the first access device 103 in response to a potential on the first word line 104. The second access device 107 may be further coupled to the second bit line 106 and to the second data node 105. The second data node 105 may be coupled to the second bit line 106 through the second access device 107 in response to a potential on the first word line 104. The third access device 109 may be further coupled to the third bit line 108 and to the first data node 101. The first data node 101 may be coupled to the third bit line 108 in response to a potential on the second word line 110. The fourth access device 112 may be further coupled to the fourth bit line 111 and to the second data node 105. The second data node 105 may be coupled to the fourth bit line 111 in response to a potential on the second word line 110.

The memory cell 100 may include a pair of cross-coupled inverters connected in parallel between the first data node 101 and the second data node 105. The first inverter 113 of the pair of cross-coupled inverters may include a pull-up transistor 114 connected between a supply voltage 115 and the first data node 101 and having a gate connected to the second data node 105. The first inverter 113 further may include a pull-down transistor 116 connected between the first data node 101 and a supply voltage 117 and having a gate connected to the second data node 105. Consequently, the pull-up transistor 114 and the pull-down transistor 116 may have series-connected terminals defining the first data node 101. The second inverter 118 of the pair of cross-coupled inverters may include a pull-up transistor 119 connected between the supply voltage 115 and the second data node 105 and having a gate connected to the first data node 101. The second inverter 118 further may include a pull-down transistor 120 connected between the second data node 105 and the supply voltage 117 and having a gate connected the first data node 101. Consequently, the pull-up transistor 119 and the pull-down transistor 120 may have series-connected terminals defining the second data node 105.

Pull-up transistors 114, 119 may be implemented as P-channel MOS transistors and pull-down transistors 116, 120 may be implemented as N-channel MOS transistors. However, the transistors 114, 116, 119, 120 may alternatively be implemented as different types of transistors. Moreover, the pair of cross-coupled inverters may not just include transistors, e.g. the pull-up transistors 114, 119, may be implemented as poly-silicon load resistors.

First access device 103, second access device 107, third access device 109 and fourth access device 112 may be implemented as transistors and the transistors may be of the same conductivity type, e.g., N-channel MOS transistors or P-channel MOS transistors.

The memory cell 100 of FIG. 1 is a dual port SRAM cell where each port is identified with respect to the input/output bit line pairs that are used to transfer data into and out of the memory cell 100. The input/output path using the first bit line 102, the second bit line 106, the first access device 103 and the second access device 107 may be referred to as a first port, and the input/output path using the third bit line 108, the fourth bit line 111, the third access device 109 and the fourth access device 112 may be referred to as a second port.

Figure 2:
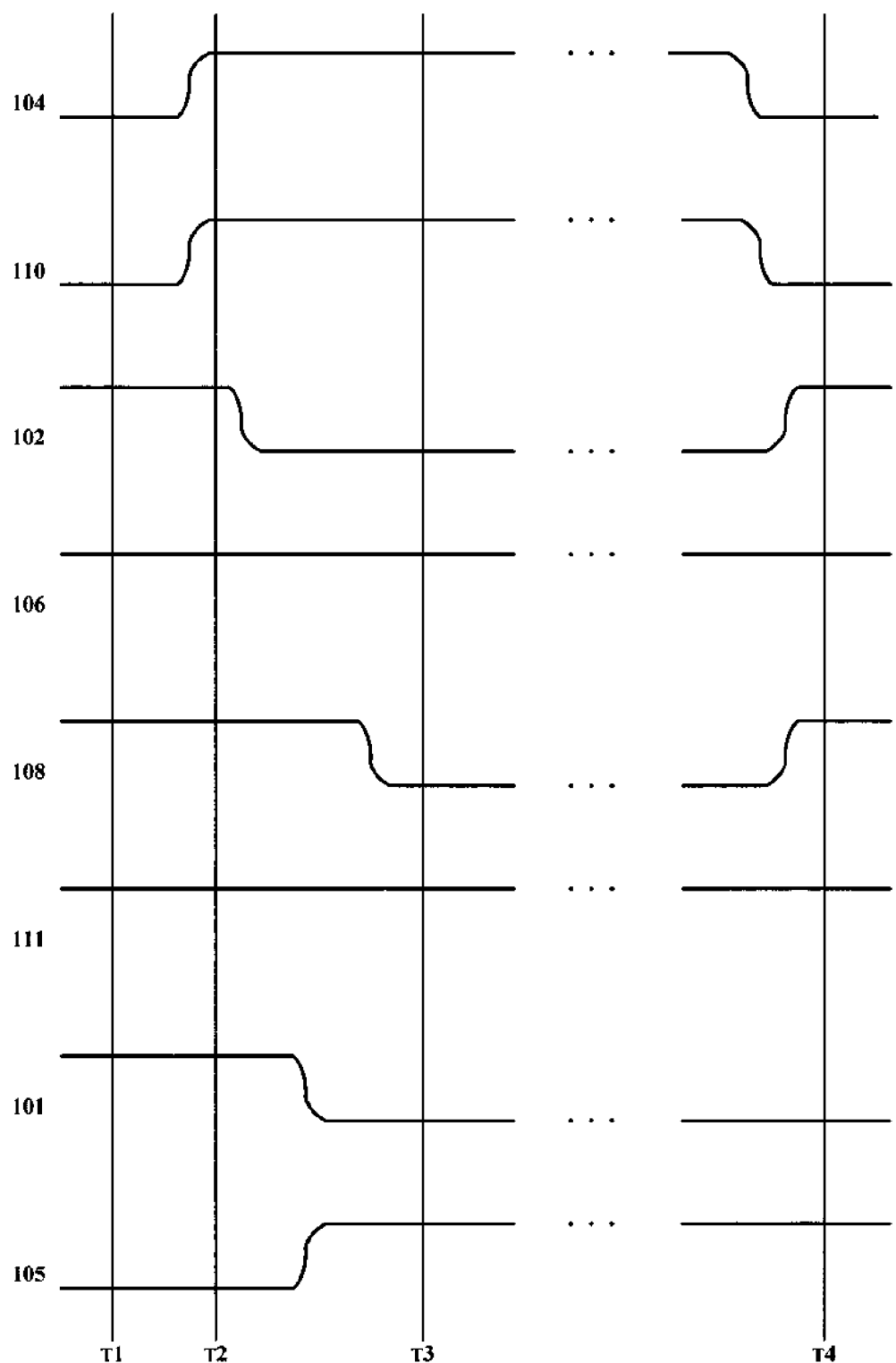
FIG. 2 is a signal waveform diagram that illustrates an exemplary operation of the memory cell illustrated and described in connection with FIG. 1.

FIG. 2 is a signal waveform diagram that illustrates an exemplary operation of the memory cell 100 illustrated and described in connection with FIG. 1. It is now assumed that initially the first data node 101 stores a logic '1' value and the complementary second data node 105 stores a logic '0' value. It is further assumed that the supply voltage 115 is a high-side power supply voltage and the supply voltage 117 is a low-side power supply voltage. Data at the logical level opposite to that of the data held on first data node 101 and second data node 105 is written into the memory cell during the operation described in FIG. 2.

At time t1, the first word line 104 and the second word line 110 are driven to a logic '0' value, i.e. they are deactivated. The first bit line 102, the second bit line 106, the third bit line 108 and the fourth bit line 111 are pre-charged to a potential, subsequently called the pre-charge voltage. The first data node 101 stores a logic '1' value and the complementary second data node 105 stores a logic '0' value.

At time t2, the first word line 104 is activated. When driving the first word line 104 to a logic '1' value the first data node 101 is coupled to the first bit line 104 via access transistor 103 and the second data node 105 is coupled to the second bit line 106 via access transistor 107. In addition, the second word line 110 is driven to a logic '1' value. Consequently, the first data node 101 is coupled to the third bit line 108 via access transistor 109 and the second data node 105 is coupled to the fourth bit line 111 via access transistor 112. By activating both, first word line 104 and second word line 110, a write access together with a read access to the memory cell 100 takes place.

At time t3, the first word line 104 and the second word line 110 are still at logic '1' value. The third bit line 108 and the fourth bit line 111 may no longer be charged to the pre-charge voltage. The first bit line 102 is driven to a logic '1' value and the second bit line 106 is driven to a logic '0' value. The voltage at the second data node 105 may be increased by a small amount of voltage, due to current flow through the fourth access device 112 and the pull-down transistor 120. This slight voltage increase at second data node 105 may weaken the pull-up transistor 114, such that when the logic '0' value is written to the first data node of the memory cell 100, via the first bit line 102 and the first access transistor 103, the cross-coupling of the inverters 113, 118 may complete more quickly. Furthermore, because of the slight voltage increase at the second data node 105, an impending transition of the second data node 105 to the logic '1' value may be sped-up because of its higher starting state.

At time t4, the first word line 104 and the second word line 110 have been deactivated, thus isolating the bit lines 102, 106, 108, 111 from the data nodes 101, 105. Bit lines 102, 106, 108, 111 may be pre-charged to the pre-charge voltage. Now, the first data node 101 stores a logic '0' value and the complementary second data node 105 stores a logic '1' value.

By driving both, first word line 104 and second word line 110, to a logic '1' value a write access is activated via the first port together with a read access via the second port. Performing a read access together with every write access may increase the write margin of the memory cell 100 and may decrease the stability of the memory cell 100. By decreasing the stability of the memory cell 100 during write accesses it may be possible to perform stable writing of the memory cell 100. Stable writing may be possible even if the high-side power supply voltage 115 is at a minimum operating voltage. In addition, stable writing may be possible for memory cells fabricated using a scaled-down process technology and/or for memory cells affected by device fluctuations. As previously described, the read access that is performed together with every write access may be used to perform stable writing. A read access that is not used to read data out of a memory may be referred to as a dummy read access.

According to the signal waveform illustrated in FIG. 2 the first word line 104 and the second word line 110 may be activated concurrently with every write access to the memory cell 100. Alternatively, the first word line 104 and the second word line 110 may be activated consecutively with every write access to the memory cell 100.

According to the signal waveform illustrated in FIG. 2 the first word line 104, to perform a write access, may be activated for the same time period as the second word line 110, to perform a concurrent read access. Alternatively, the first word line 104 may be activated for a longer time period than the second word line 110.

Figure 3:
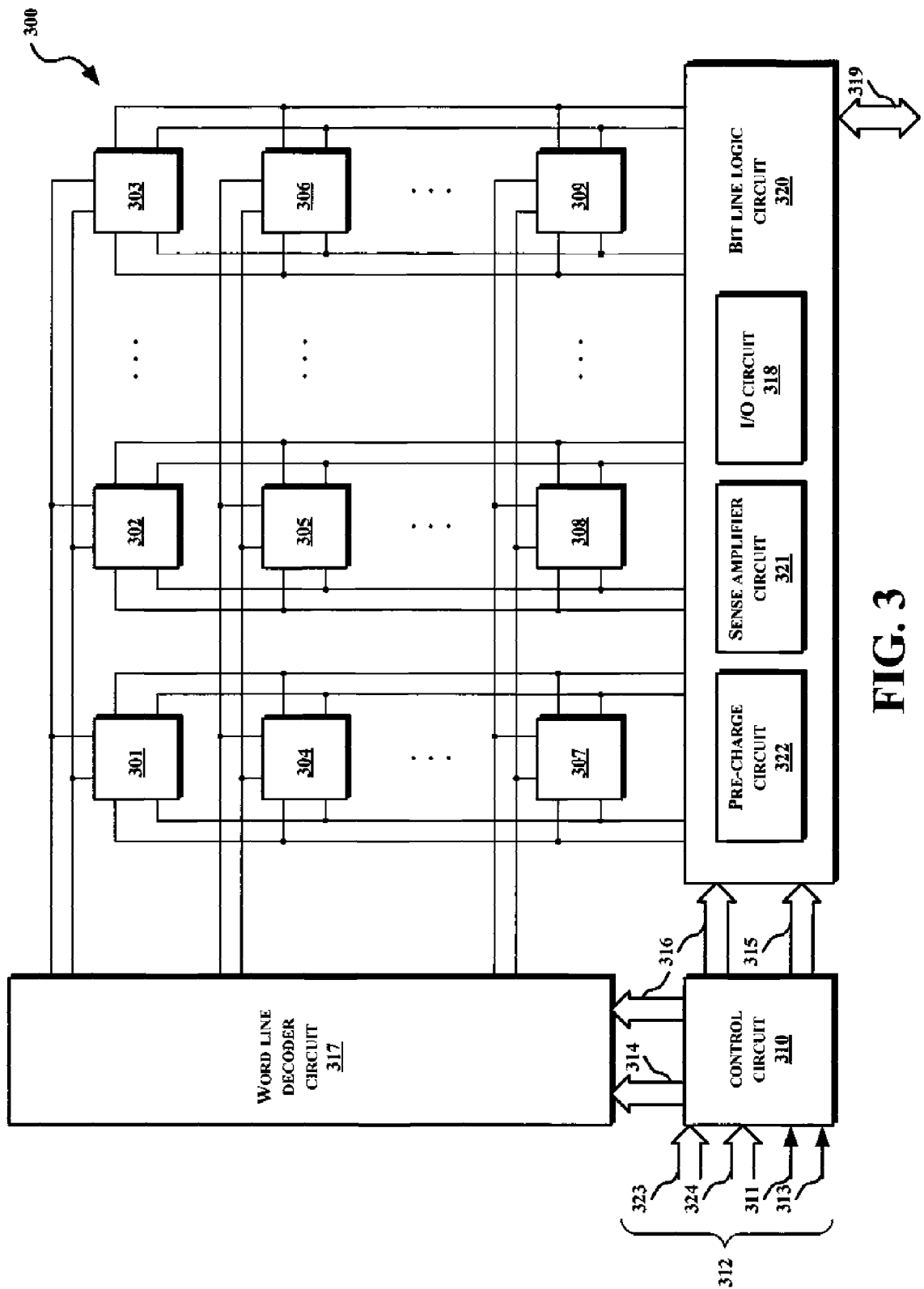
FIG. 3 illustrates a schematic circuit diagram of a semiconductor memory including a memory cell array.

FIG. 3 illustrates a schematic diagram of a construction of a semiconductor memory including a memory cell array 300. The memory cell array 300 as shown in FIG. 3 may be implemented as a cache memory in a data processor or as a frame buffer in a video chip. The memory cell array 300 may also be implemented as other technologies as well. Memory cells 301, 302, 303, 304, 305, 306, 307, 308, 309 are representative memory cells that represent a plurality of memory cells. Each of the plurality of memory cells may be a memory cell 100 as illustrated and described in connection with FIG. 1. A control circuit 310 may be coupled to first and second word lines and may activate read and write accesses to the memory cells. The control circuit 310 may receive several input signals 312. At least one of these input signals 312 may be a write access input signal 311 that triggers the control circuit 310 to write data to at least one memory cell. The control circuit 310 may activate a read access to the at least one memory cell in response to the at least one write access input signal 311. As was discussed earlier herein, the read access that is performed with every write access may be used to perform stable writing of a memory cell. A read access that is not used to read data out of a memory may be referred to as a dummy read access.

When the at least one write access input signal 311 gets activated the control circuit 310 may initiate the read access and a write access concurrently. As shown in the signal waveform diagram of FIG. 2 one first word line 104 and one second word line 110 may be switch at the same time from a deactivated state to an activated state. The first word line 104 may be used to perform the write access and the second word line 110 may be used to perform the read access. The first word line 104 may stay in the activated state for a longer time period than the second word line 110.

After activation of the at least one write access input signal 311 the control circuit 310 may perform a write access and a read access to the same memory cell. At the reception of the at least one write access input signal 311 the control circuit 310 may activate a first word line and a second word line and the first and second word lines may be connected to the same memory cell.

The control circuit 310 may receive several input signals 312, e.g. address signals, read/write enable signals and/or chip enable signals. At least one of these input signals 312 may be the write access input signal 311 and at least one of these input signals 312 may be a read access input signal 313. The control circuit 310 may logically combine the write access input signal 311 with the read access input signal 313. The control circuit 310 may perform a read access to at least one memory cell when at least one of the write access input signals is activated and none of the read access input signals is activated.

The control circuit 310 may produce internal row address signals 314, internal column address signals 315 and control signals 316 required for various operations according to the applied input signals 312. The internal row address signals 314 may be connected to a word line decoder circuit 317. The word line decoder circuit 317 may decode the internal row address signals 314 and may drive the first word lines and the second word lines according to the internal row address signals 314.

The memory cell array 300 may include an I/O-circuit 318 that receives data and provides data at an I/O terminal 319. As shown in FIG. 3, the I/O circuit 318 may be part of a bit line logic circuit 320. The bit line logic circuit 320 may be connected to the internal column address signals 315. In a data write operation, the I/O circuit 318 may transmit data received at the I/O terminals 319 to first complementary bit line pairs and/or second complementary bit line pairs according to the internal column address signals 315.

The memory cell array 300 may include a sense amplifier circuit 321. The sense amplifier circuit 321 may be part of the bit line logic circuit 320, part of the I/O circuit 318 or may be coupled to the I/O circuit 318. The sense amplifier circuit 321 receives data from the first complementary bit line pairs and/or from the second complementary bit line pairs according to the internal column address signals 315. In a data read operation the sense amplifier circuit 321 senses voltage differentials received from a complementary bit line pair and produces amplified data that are transmitted to the I/O terminal 319. During a dummy read access, no sensing of the complementary bit line pair associated with the dummy read access may take place in the sense amplifier circuit 321 and no data may be passed from the sense amplifier circuit 321 to the I/O terminal 319.

The memory cell array 300 may include a pre-charge circuit 322 that is coupled to first complementary bit line pairs and to second complementary bit line pairs. The pre-charge circuit 322 may be part of the bit line logic circuit 320 and/or part of the I/O circuit 318. The pre-charge circuit 322 charges the first complementary bit line pairs and the second complementary bit line pairs to a pre-charge voltage when there is no access to the memory cell array. During a write access to memory cells, the one or more complementary bit line pairs associated with the write operation may not be pre-charged for a period of time to allow writing to the memory cells. During a dummy read access, the complementary bit line pairs associated with the dummy read operation may also not be pre-charged for a period of time. Similar to a conventional read operation, the complementary bit line pairs associated with the dummy read access may be sensed by the sense amplifier circuit 321 and data may be passed to the I/O terminals 319. Alternatively, the complementary bit line pairs associated with the dummy read access may be charged to the pre-charge voltage during the dummy read operation.

The memory cell array 300 as shown in FIG. 3 includes dual port memory cells. Each memory cell is connected to the word line decoder circuit 317 via a first word line and a second word line. Furthermore, each memory cells is connected to the bit line logic circuit 320 via a first complementary bit line pair and a second complementary bit line pair. The input signals 312 of the control circuit 310 in a dual port memory cell array 300 may include two address busses 323, 324. One address bus 323, 324 may be used to access the first port of the dual port memory cells and the other address bus 323, 324 may be used to access the second port of the dual port memory cells. According to one implementation, it is possible to perform both, read and write accesses, via the first port and it is possible to perform both, read and write accesses, via the second port. In an alternative implementation, memory cell array 300 may include a plurality of two port memory cells and one of the two ports of the memory cells may be dedicated to write operations and the other port of the memory cells may be dedicated to read operations.

The partitioning of the blocks 310, 317, 318, 320, 321, 322 may differ from the configuration illustrated in FIG. 3. Moreover, all blocks 310, 317, 318, 320, 321, 322 together with the memory cells may be implemented on a single semiconductor device. Alternatively, some blocks or part of blocks may be implemented on different semiconductor devices. Further circuits, which are not shown in FIG. 3, like bit line equalizer circuits, read assist circuits and/or further write assist circuits may be part of the memory cell array 300. FIG. 3 does not reflect all or part of the actual physical layout of the memory cell array 300.

Figure 4:
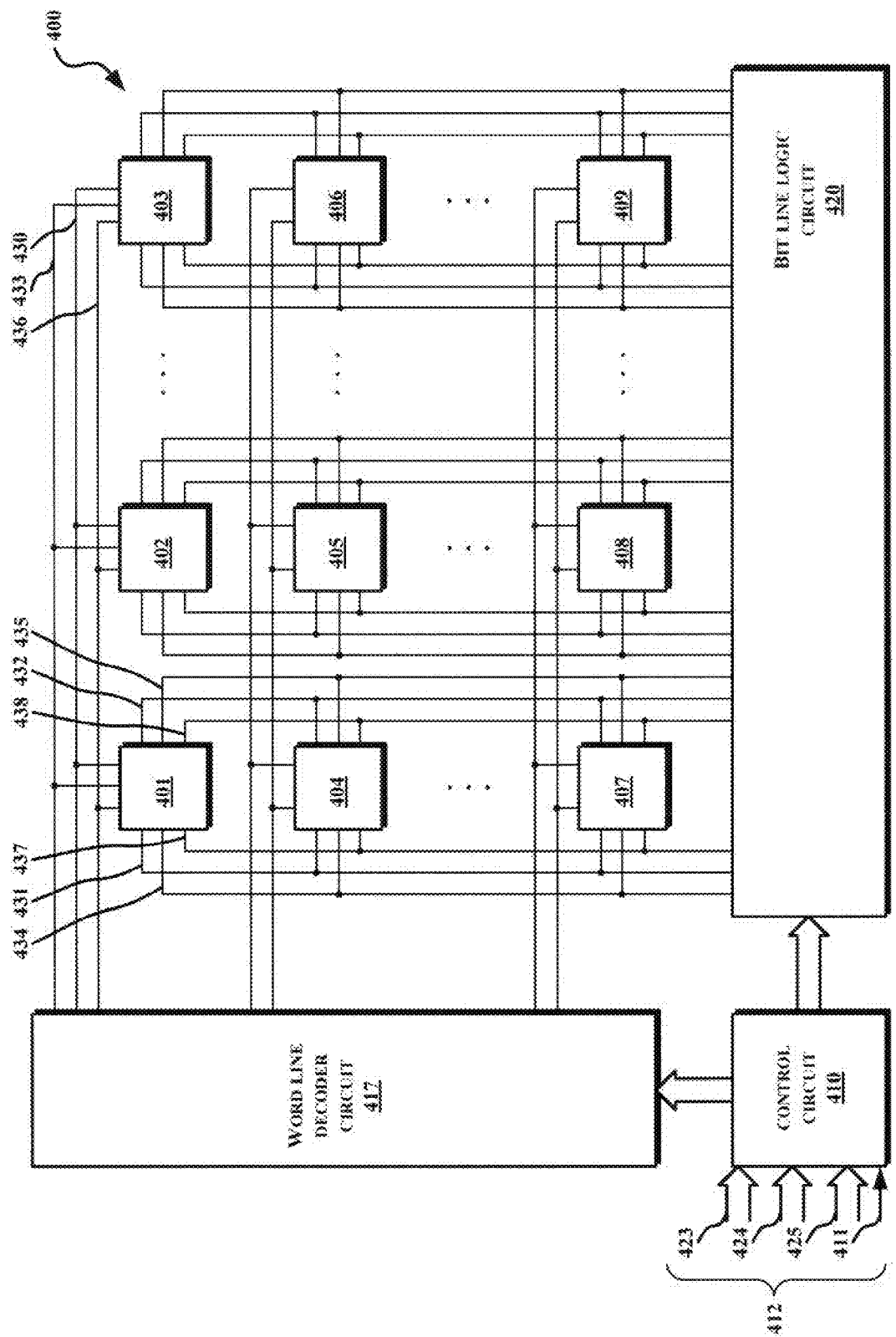
FIG. 4 illustrates a schematic circuit diagram of a semiconductor memory including a memory cell array including three port memory cells.

The memory cell array may include multi port memory cells. FIG. 4 illustrates a schematic diagram of a construction of a semiconductor memory including a memory cell array 400 that includes three port memory cells. Memory cells 401, 402, 403, 404, 405, 406, 407, 408, 409 are representative memory cells that represent a plurality of three port memory cells. A control circuit 410 may be similar to the control circuit 310 of FIG. 3, a word line decoder circuit 417 may be similar to the word line decoder circuit 317 of FIG. 3 and a bit line logic circuit 420 may be similar to the bit line logic circuit 320 of FIG. 3. The control circuit 410 may receive several input signals 412. The input signals 412 may include at least one write access input signal 411 and three address busses 423, 424, 425. The address bus 423 may be used to access port one, the address bus 424 may be used to access port two and the address bus 425 may be used to access port three of the three port memory cells.

A complementary bit line pair and a word line may be associated with each port. E.g. for the memory cell 401 the assignment may be as follows: port one may be associated with a word line 430, a bit line 431 and a complementary bit line 432, port two may be associated with a word line 433, a bit line 434 and a complementary bit line 435 and port three may be associated with a word line 436, a bit line 437 and a complementary bit line 438.

When receiving the at least one write access input signal 411, the control circuit 410 may initiate a write access on port one and may initiate read accesses on ports two and three. The write access and the read access may be to the same memory cell. Alternatively, when receiving the at least one write access input signal 411, the control circuit 410 may initiate a write access on port one and may initiate a read access on port two. There may be no access on port three.

As illustrated in FIG. 4 the memory cell array 400 is arranged in a matrix of rows and columns. The word lines are coupled to the memory cells associated with the same row and the complementary bit line pairs are coupled to the memory cells associated with the same column. The word line decoder circuit 417 may provide one word line signal per port for all memory cells belonging to the same row. E.g., in FIG. 4, the word line decoder circuit 417 may provide word line 430 for port one of memory cells 401, 402, 403 which all belong to the same row. The bit line logic circuit 420 may provide one complementary bit line pair per port for all memory cells belonging to the same column. E.g., in FIG. 4, the bit line logic circuit 420 may provide bit line 431 and complementary bit line 432 for port one of memory cells 401, 404, 407 which all belong to the same column.

For performing a write access to at least one memory cell, e.g. to memory cell 401, the word line of one port, e.g. word line 430 of port one, may be activated. To increase the write margin the word line of at least one further port of the at least one memory cell may be activated and a dummy read may be performed. E.g. the word line 433 of port two may be activated to perform a dummy read access on memory cell 401.

Although FIG. 4 shows three port memory cells, in an alternative implementation, the memory cell array may include memory cells that have more than three ports.

Figure 5:
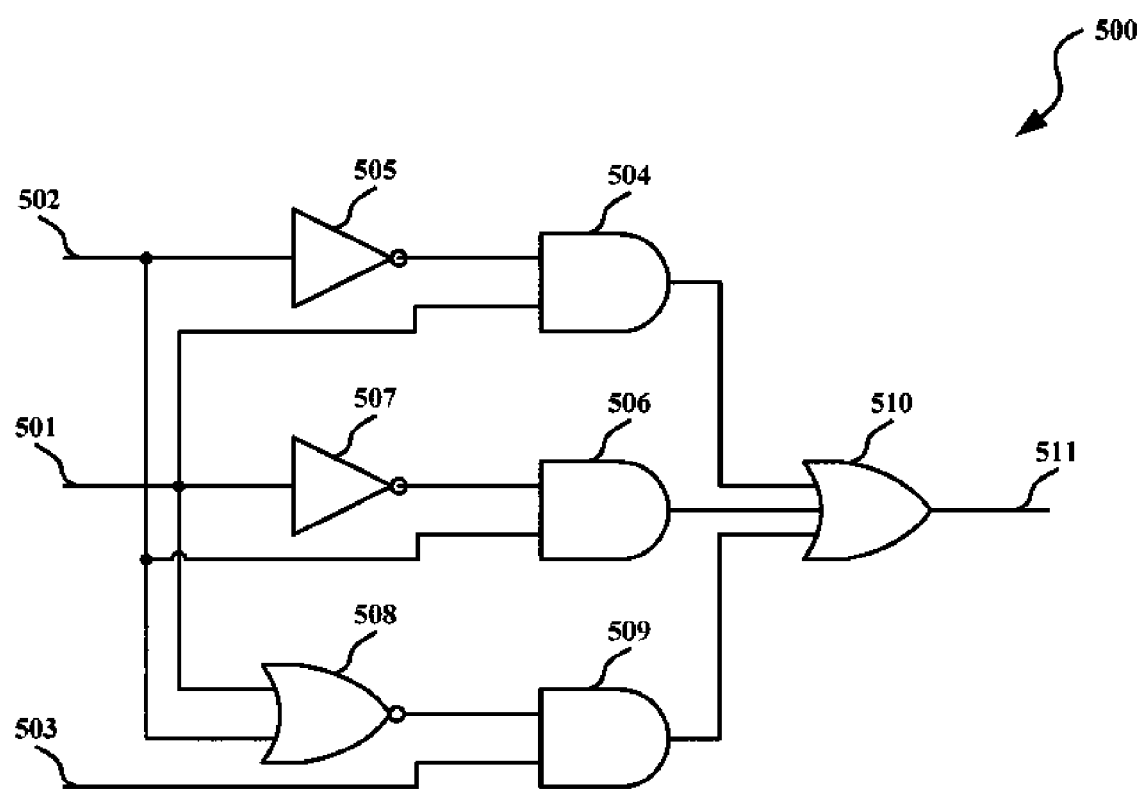
FIG. 5 illustrates a schematic circuit diagram of a logic circuit that may be part of a control circuit illustrated and described in connection with FIG. 3.

FIG. 5 illustrates a circuit diagram of a logic circuit 500 that may be part of the control circuit 310, of the word line decoder circuit 317 or of any other circuit of the memory cell array. The logic circuit 500 may be implemented for each word line of a memory cell array, i.e. for each port and for each row of memory cells in a memory cell array that is arranged in a matrix of rows and columns.

An input 501 denotes a read access to a first port of a memory cell, an input 502 denotes a write access to the first port of the memory cell and an input 503 denotes a write access to a second port of the memory cell. An AND gate 504 receives the input signal 501 and an inverted input signal 502 which is inverted by an inverter 505. An AND gate 506 receives the input signal 502 and an inverted input signal 501 which is inverted by an inverter 507. A NOR gate 508 receives the input signal 501 and the input signal 502. An output signal of the NOR gate 508 is connected to one input of an AND gate 509. Another input of the AND gate 509 is connected to the input signal 503. Output signals of the AND gate 504, the AND gate 506 and the AND gate 509 are connected to inputs of an OR gate 510. An output signal of the OR gate 510 drives an output 511 of the logic circuit 500. The output 511 may be the word line signal associated with the first port of the memory cell. The input signals 501, 502, 503 may be generated in the control circuit 310 or in the word line decoder circuit 317 in response to the input signals 312.

Figure 6:
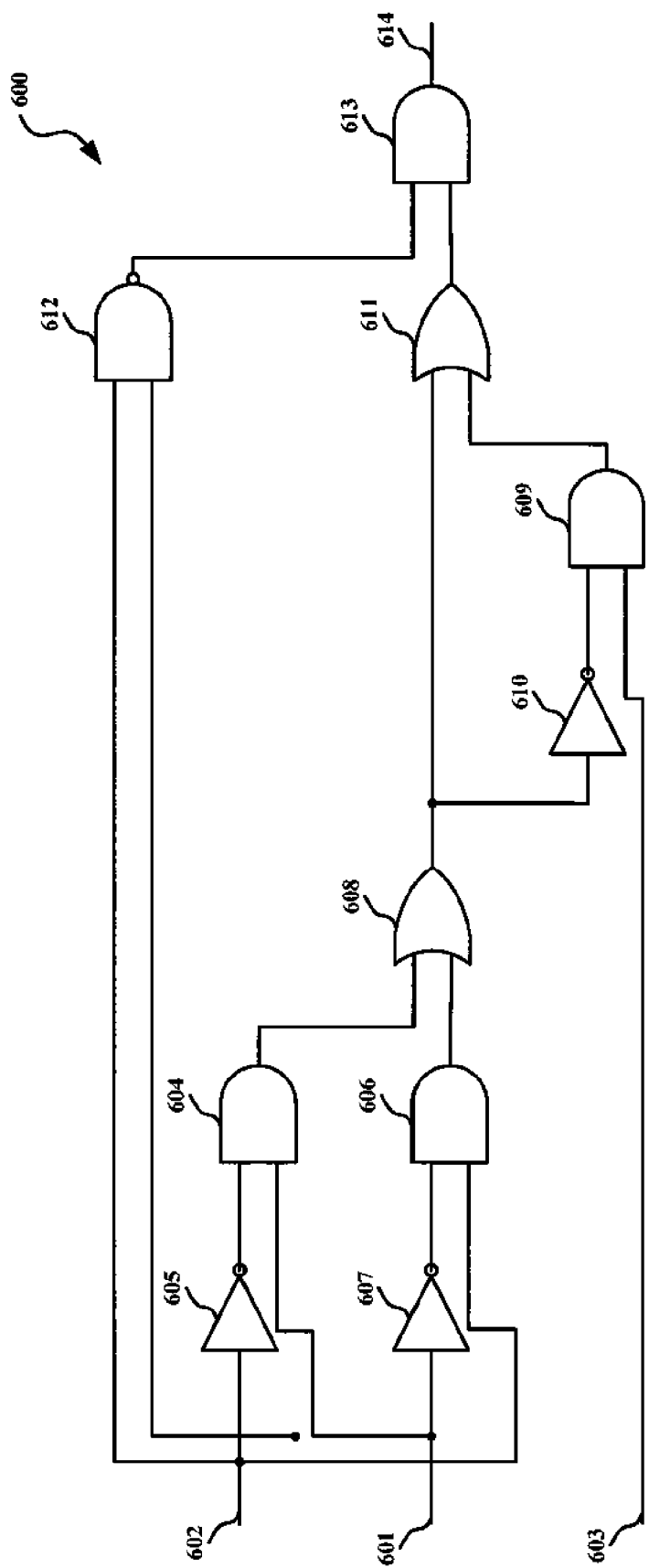
FIG. 6 illustrates a schematic circuit diagram of a further logic circuit that may be part of a control circuit illustrated and described in connection with FIG. 3.

FIG. 6 illustrates a circuit diagram of a further logic circuit 600 that may be part of the control circuit 310, of the word line decoder circuit 317 or of any other circuit of the memory cell array. The logic circuit 600 may be implemented for each word line of a memory cell array, i.e. for each port and for each row of memory cells in a memory cell array that is arranged in a matrix of rows and columns.

An input 601 denotes a read access to a first port of a memory cell, an input 602 denotes a write access to the first port of the memory cell and an input 603 denotes a write access to a second port of the memory cell. An AND gate 604 receives the input signal 601 and an inverted input signal 602 which is inverted by an inverter 605. An AND gate 606 receives the input signal 602 and an inverted input signal 601 which is inverted by an inverter 607. An OR gate 608 receives an output signal of the AND gate 604 and an output signal of the AND gate 606. An AND gate 609 receives the input signal 603 and an inverted output signal of the OR gate 608 which is inverted by an inverter 610. An OR gate 611 receives an output signal of the OR gate 608 and an output signal of the AND gate 609. A NAND gate 612 receives the input signal 601 and the input signal 602. An AND gate 613 receives an output signal of the NAND gate 612 and an output signal of the OR gate 611. An output signal of the AND gate 613 drives an output 614 of the logic circuit 600. The output 614 may be the word line signal associated with the first port of the memory cell. The input signals 601, 602, 603 may be generated in the control circuit 310 or in the word line decoder circuit 317 in response to the input signals 312.

For both logic circuits 500, 600, depending on the input signals 501, 502, 503, 601, 602, 603 there may be three cases when the outputs 511, 614 are active. In the first case, the outputs 511, 614 are active if there is a read access to the first port and no concurrent write access to the first port. In the second case, the outputs 511, 614 are active if there is a write access to the first port and no concurrent read access to the first port. In the third case, the outputs 511, 614 are active if there is a write access to the second port and no concurrent write access to the first port and no concurrent read access to the first port. The third case corresponds to the dummy read access as previously described for FIG. 2 and FIG. 3

Signals depicted in FIG. 5 and in FIG. 6 have active high logic levels, i.e. a signal is said to be asserted when the signal is driven to a high logic state. According to an alternative implementation, the logic circuits 500, 600 may be constructed in a way that the signals have active low logic levels. In order to increase the write margin of a memory cell the logic circuits 500, 600 or a logically equivalent circuit may be coupled to any memory cell which includes at least two ports. The logic circuits 500, 600 may denote a small change in the design of a memory cell array which may be limited to a certain area in the memory cell array. No operation except the write operation may be influenced, e.g. the read stability or the timing of a memory cell may be maintained by the logic circuits 500, 600 as shown in FIG. 5 and in FIG. 6.

Figure 7:
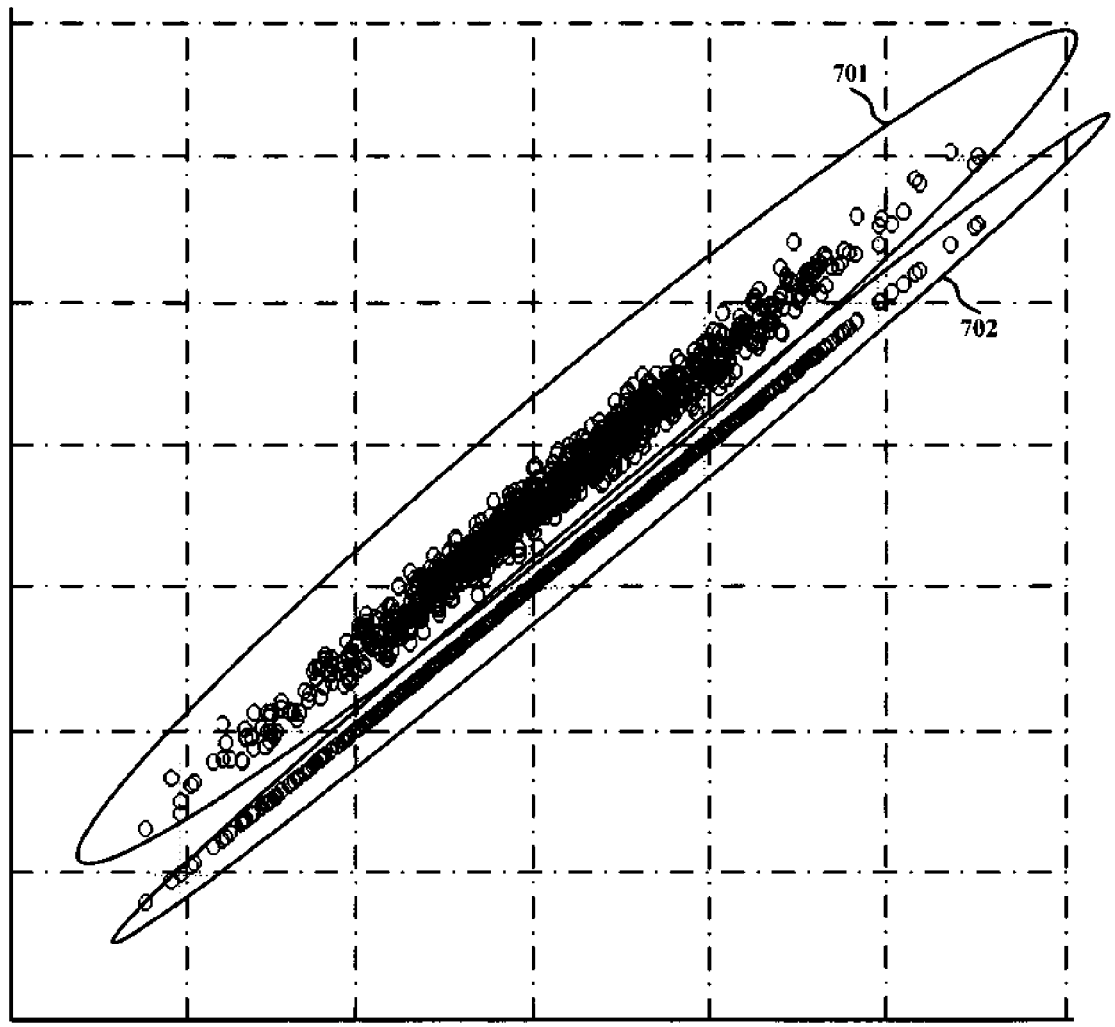
FIG. 7 illustrates simulation results of write margin values of several memory cells.

FIG. 7 illustrates simulation results of write margin values of several memory cells. Region 701 shows write margin values of memory cells according to one of the implementations described in FIGS. 1, 3 and 4, herein called memory cells with write assist feature. Region 702 shows write margin values of memory cells without write assist feature. The write margin values are displayed as a function of write margin values of memory cells without the write assist feature described in conjunction with the implementations described herein. The voltage value of write margins of memory cells without the write assist feature is shown along the x-axis and the voltage value of write margins for both, memory cells with and without the write assist feature, is shown along the y-axis. As for region 702 the write margin values without the write assist feature are plotted along the x-axis and along the y-axis, all the write margin values in region 702 are located on a straight line which originates at the cross point of the x-axis and the y-axis and which runs along an angle of 45 degree related to both the x-axis and the y-axis. As can be seen, the write margin values of memory cells with the write assist feature are higher than the write margin values of memory cells without the write assist feature. Simulation results show, for memory cells with the write assist feature, the mean value of the write margin is 386 mV and the standard deviation is 39 mV. For memory cells without the write assist feature the mean value of the write margin is 359 mV and the standard deviation is 38.6 mV.

Figure 8:
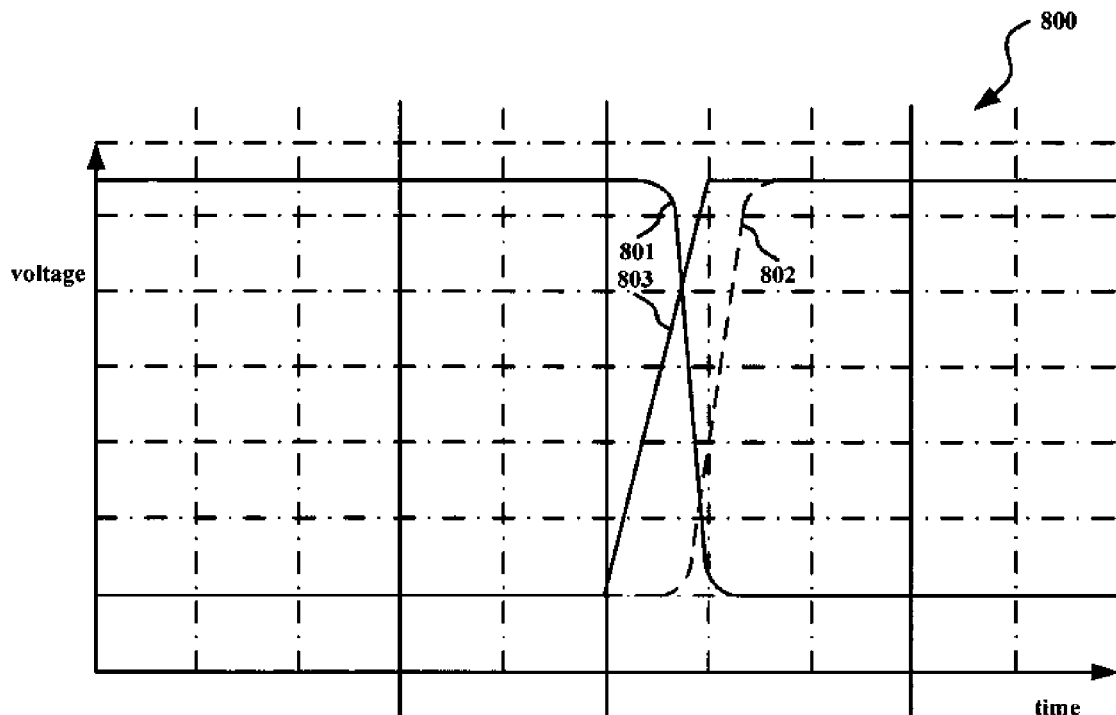
FIG. 8 illustrates a graph showing voltage simulation results during a write access to a memory cell.

FIG. 8 illustrates a graph 800 showing voltage simulation results during a write access to a memory cell according to one of the implementations described in FIGS. 1, 3 and 4. The graph 800 includes a signal 801 which illustrates a voltage level at a first data node 101 of a memory cell 100. Graph 800 includes further a signal 802 which illustrates a voltage level at a complementary second data node 105 of the memory cell 100 and a signal 803 which illustrates a voltage level at a word line 104, 110 associated with one port of the memory cell. The voltage levels are displayed as a function of time, where time is shown along the x-axis and voltage is shown along the y-axis.

At time t1, the first data node 101 stores a logic '1' value and the complementary second data node 105 stores a logic '0' value. The signal 801 corresponds to a logic '1' value and the signal 802 corresponds to a logic '1' value. The word line 104, 110 is deactivated and the signal 803 corresponds to a logic '0' value. At time t2, a write access to the memory cell is started and the word line 104, 110 gets asserted, i.e. the signal 803 moves from a logic '0' value to a logic '1' value. The first and second data nodes 101, 105 change their logic values. As a result, at time t3, the signal 801 corresponds to a logic '0' value and the signal 802 corresponds to the complementary value, which is a logic '1' value.

Figure 9:
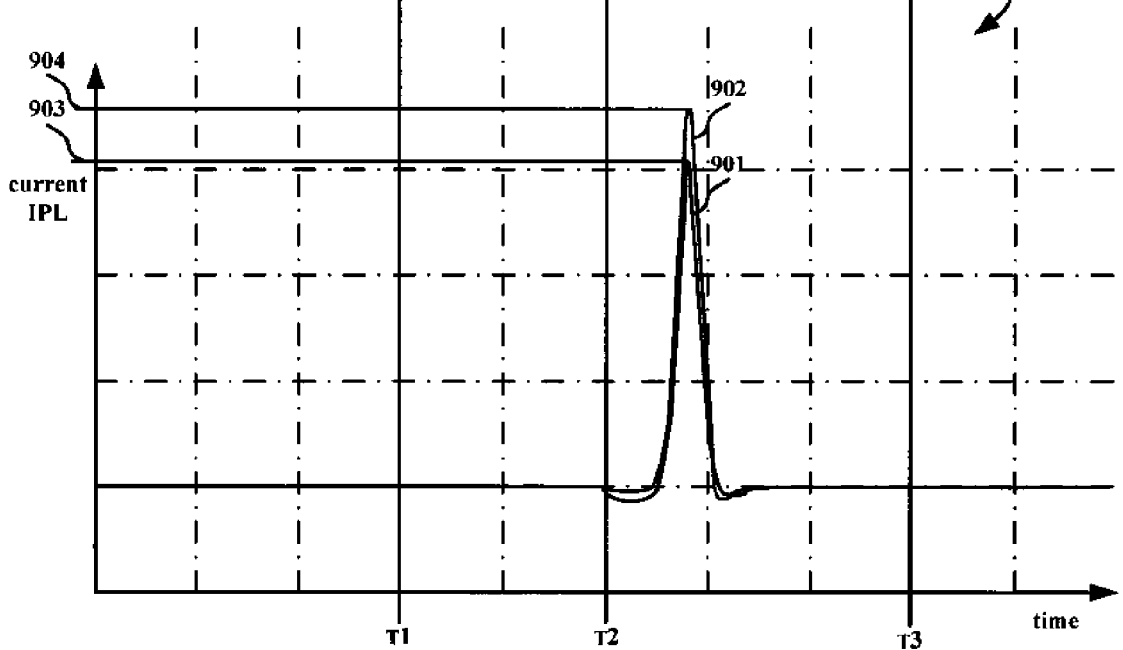
FIG. 9 illustrates a graph showing current simulation results corresponding to the write access to a memory cell illustrated in FIG. 8.

FIG. 9 illustrates a graph 900 showing current simulation results corresponding to the write access to a memory cell illustrated in FIG. 8. The graph 900 includes signals 901 and 902 which illustrate currents IPL through the pull-up transistor whose gate is connected to the second data node of the memory cell. The signal 901 depicts the current IPL of a memory with the write assist feature and the signal 902 depicts the current IPL of a memory without the write assist feature. The currents IPL are displayed as a function of time. The time is shown along the x-axis and the currents IPL are shown along the y-axis. The scale of the x-axis in FIG. 9 is the same as the scale of the x-axis of FIG. 8.

At time t1, the memory cell is in a static state and the signals 901, 902 correspond to a zero value which means that no current IPL flows through the pull-up transistor whose gate is connected to the second data node of the memory cell. During the time when the signal 803 moves from a logic '0' value to a logic '1' value the current IPL starts to flow through the pull-up transistor as the values of the data nodes 101, 105 of the memory cell get changed. Both signals 901, 902 reach their maximum value between time t2 and time t3 which is the time period when the values of first and second data nodes 101, 105 get flipped. The maximum value 903 of signal 901 is lower than the maximum value 904 of signal 902. Therefore, the maximum current IPL of the memory cell with the write assist feature is lower than the maximum current IPL of the memory cell without the write assist feature. At time t3, the memory cell is again in a static state and the signals 901, 902 correspond to a zero value.

As described for FIG. 2 above, during the write access to a memory that uses an exemplary write assist feature, a slight voltage increase at the second data node may weaken the pull-up transistor as the voltage level at the gate terminal of the pull-up transistor may be slightly increased. The slight increase of the voltage level at the gate terminal of the pull-up transistor may effect a reduction of current IPL. Therefore the maximum value 903 of current IPL of memory cells with the write assist feature is lower than the maximum value 904 of current IPL of memory cells without the write assist feature.

Figure 10:
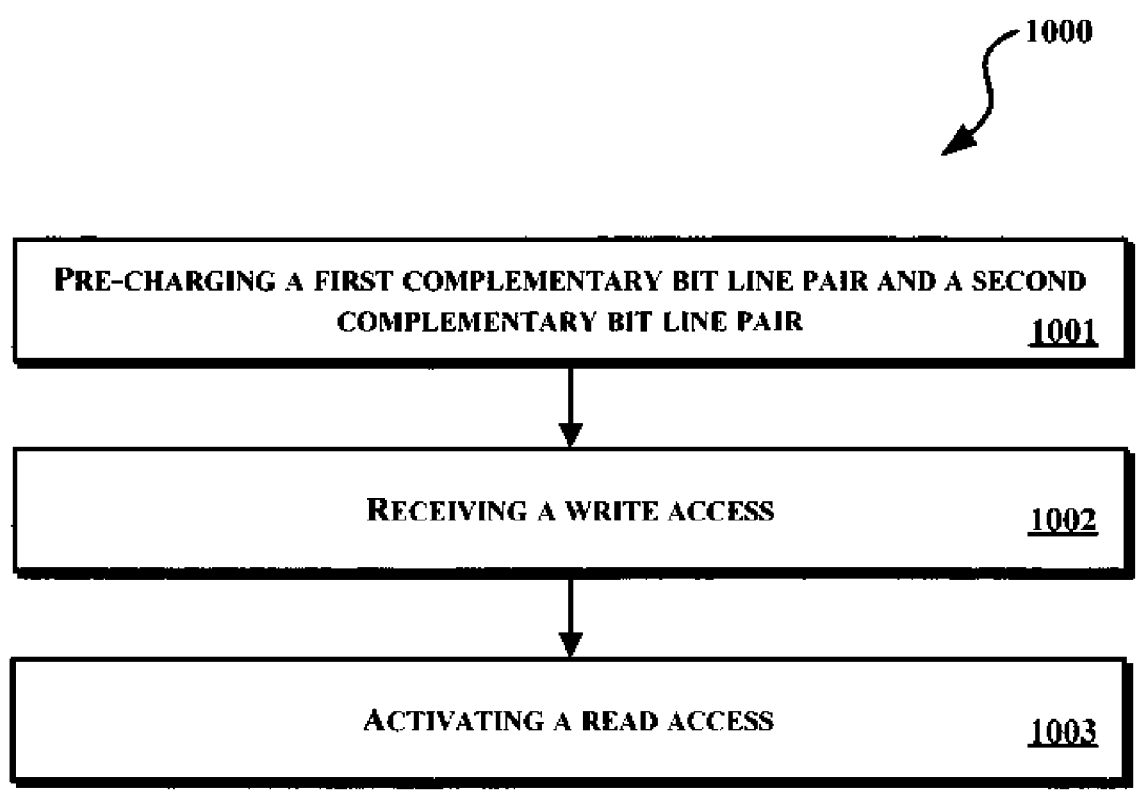
FIG. 10 illustrates a flow diagram that includes a number of operations for accessing a memory cell.

FIG. 10 illustrates a flow diagram 1000 that includes a number of operations for accessing a memory cell. Unless stated otherwise, the order in which the operations are described is not intended to be construed as a limitation. Blocks may be repetitive, may be combined in any order and/or may be in parallel to implement the process. In portions of the following discussion, reference may be made to the illustrations of FIG. 1-7 and the subject matter thereof. The procedure described in FIG. 10 may be realized utilizing the previously described implementations.

At block 1001, a first complementary bit line pair and a second complementary bit line pair of a memory cell, such as the memory cell 100 illustrated in FIG. 1, are pre-charged. The complementary bit line pairs may be pre-charged to a predetermined pre-charge voltage level prior to a read and/or write accesses to the memory cell. The implementation of complementary bit line pairs in a memory cell allows for a differential sensing of the bit line pairs during a read access. Differential sensing may work steadily even in the presence of noise and/or offset. Therefore, memory cells having complementary bit line pairs may be unsusceptible to noise in neighboring circuit elements.

At block 1002, the memory cell receives a write access. The memory cell may receive the write access via a word line that is associated with one port of the memory cell. During the write access, the word line may be driven to an active level. As shown in FIG. 3 the memory cell may be included in a memory cell array 300 and the word line may be driven by a word line decoder circuit 317.

At block 1003, a read access is activated to the memory cell. The read access may be activated by asserting a word line that is associated with one port of the memory cell. The write access at block 1002 may be performed on another port of the memory cell than the read access at block 1003. The process of performing a write access via a first port together with a read access via a second port may decrease the stability of the memory cell, while at the same time, the write margin may be increased. By increasing the write margin, the state of the memory cell may be flipped more easily during the write access, and the risk of an unsuccessful write access may be reduced.

As shown in FIG. 3 the memory cell may be part of a memory cell array. The memory cells of the memory cell array may be arranged in a matrix of rows and columns. At block 1003, a read access may be activated to all memory cells that are located in the same row as the memory cell that may receive a write access at block 1002. The memory cell array may include a plurality of multi port memory cells. At block 1002, a memory cell may receive a write access via one port; and at block 1003, all memory cells that are located in the same row as the memory cell of block 1002 may receive a read access via one or more of the other ports.

For the purposes of this disclosure and the claims that follow, the terms "coupled" and "connected" have been used to describe how various elements interface. Such described interfacing of various elements may be either direct or indirect. The interconnections between circuit elements or circuit blocks have been shown or described as multi conductor or single conductor signal lines. Each of the multi conductor signals lines may alternatively be single conductor signal lines, and each of the single conductor signal lines may alternatively be multi conductor signals lines. Signals described or depicted as having active high or active low logic levels may have opposite active logic levels in alternative implementations. A signal is said to be "asserted" when the signal is driven to a logic '1' value or logic '0' value, or charged to a logic '1' value or logic '0' value, to indicate a particular condition. Conversely, a signal is said to be deasserted to indicate that the signal is driven, or charged or discharged, to a state other than the asserted state. A signal line is said to be "activated" when a signal is asserted on the signal line, and "deactivated" when the signal is deasserted. Circuits that have been described or depicted as including metal oxide semiconductor (MOS) transistors may alternatively be implemented using bipolar technology or any other technology. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A memory cell, comprising:
   a first data node and a second data node to store complementary data;
   a first word line coupled to a first access device and to a second access device;
   a second word line coupled to a third access device and to a fourth access device;
   a first complementary bit line pair coupled to the first and second data nodes;
   a second complementary bit line pair coupled to first and second data nodes; and
   a control circuit coupled to the first and second word lines, the control circuit configured to activate a read access to the memory cell in response to at least one write access input signal, wherein the control circuit is further configured to logically combine at least one read access input signal with the at least one write access input signal and to activate the read access to the memory cell when the at least one write access input signal is activated and no read access input signal is activated.

2. The memory cell of claim 1, wherein the first word line and the second word line to initiate the read access to the memory cell concurrently with every write access to the memory cell.

3. The memory cell of claim 1, wherein the first complementary bit line pair being coupled to the first and second data nodes in response to a potential on the first word line; and the second complementary bit line pair being coupled to the first and second data nodes in response to a potential on the second word line.

4. The memory cell of claim 1, further comprising a cross-coupled first inverter and second inverter, each of the first inverter and the second inverter comprising a pull-up transistor and a pull-down transistor having series-connected terminals defining the first data node and the second data node.

5. The memory cell of claim 1, wherein the first access device and the second access device are further coupled to the first complementary bit line pair and to the first data node and the second data node;
   and the third access device and the fourth access device are further coupled to the second complementary bit line pair and to the first data node and the second data node.

6. The memory cell of claim 1, wherein the first access device, the second access device, the third access device and the fourth access device are of the same conductivity type.

7. A memory device, comprising:
   a memory cell array comprising a plurality of memory cells, each one in the plurality of memory cells comprising:
   a first data node and a second data node to store complementary data;
   a first word line coupled to a first access devices and to a second access device;
   a second word line coupled to a third access device and to a fourth access device;
   a first complementary bit line pair coupled to the first and second data nodes; and
   a second complementary bit line pair coupled to the first and second data nodes; and
   a control circuit coupled to a plurality of the first and second word lines, the control circuit configured to activate read and write accesses to at least one memory cell in the plurality of memory cells, the control circuit further configured to activate a read access to at least one memory cell in the plurality of memory cells in response to at least one write access input signal, wherein the control circuit is further configured to logically combine at least one read access input signal with the at least one write access input signal and to activate the read access to the at least one in the plurality of memory cells when the at least one write access input signal is activated and no read access input signal is activated.

8. The memory device of claim 7, wherein the read access to the at least one in the plurality of memory cells is a dummy read access.

9. The memory device of claim 7, wherein the control circuit is configured to activate the read access and a write access to the same memory cell in response to the at least one write access input signal.

10. The memory device of claim 7, wherein the control circuit is configured to initiate the read access and a write access concurrently.

11. The memory device of claim 10, wherein the control circuit is configured to activate the write access for a longer time period than the read access.

12. The memory device of claim 7, further comprising a pre-charge circuit coupled to a plurality of first and second complementary bit line pairs, the pre-charge circuit to prevent charge of a first and second complementary bit line pair of the at least one of the plurality of memory cells during the read access to the at least one of the plurality of memory cells.

13. The memory device of claim 7, further comprising an I/O-circuit configured to prevent data transfer from first and second data nodes to a data output during the read access to the at least one in the plurality of memory cells, wherein the read access is a dummy read access.

14. The memory device of claim 7, wherein the memory cells are arranged in a matrix of rows and columns; a first word line coupled to a plurality of memory cells associated with a row of the plurality of rows in the matrix; a second word line coupled to a plurality of memory cells of the row; a first complementary bit line pair coupled to a plurality of memory cells associated with a column of the plurality of columns in the matrix; and a second complementary bit line pair coupled to a plurality of memory cells associated with the column.

15. The memory device of claim 14, wherein the control circuit is configured to activate the read access to a plurality of memory cells of the row.

16. A device, comprising:

a memory cell array comprising a plurality of memory cells, each one in the plurality of memory cells comprising:

a first data node and a second data node to store complementary data; and a plurality of ports comprising a first complementary bit line pair and a second complementary bit line pair, the plurality of ports configured to access the first data node and the second data node; and a control circuit coupled to the plurality of ports to activate a read access to at least one port of the plurality of ports in response to at least one write access input signal, wherein the control circuit is further configured to logically combine at least one read access input signal with the at least one write access input signal and to activate the read access when the at least one write access input signal is activated and no read access input signal is activated.

17. A method of accessing a memory cell, comprising:

pre-charging a first complementary bit line pair and a second complementary bit line pair of the memory cell to a voltage;

receiving a write access at the memory cell;

receiving a read access at the memory cell;

combining signals associated with the received write and read accesses; and activating a read access to the memory cell in response to the write access.

18. The method of claim 17, further comprising:

activating a write access to the memory cell.

19. The method of claim 17, further comprising:

initiating the read access and a write access to the memory cell concurrently.

20. The method of claim 19, wherein the time period of the activation of the read access is shorter than the time period of the activation of the write access.

* * * * *